(12) United States Patent
Kuo et al.

(10) Patent No.: US 9,104,833 B2
(45) Date of Patent: Aug. 11, 2015

(54) MASK SET FOR DOUBLE EXPOSURE PROCESS AND METHOD OF USING THE MASK SET

(71) Applicant: UNITED MICROELECTRONICS CORP., Hsin-Chu (TW)

(72) Inventors: Hui-Fang Kuo, Tainan (TW); Ming-Jui Chen, Hsinchu (TW); Ting-Cheng Tseng, Tainan (TW); Cheng-Te Wang, Hsinchu County (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/287,079

(22) Filed: May 26, 2014

(65) Prior Publication Data

US 2014/0258946 A1   Sep. 11, 2014

Related U.S. Application Data

(63) Continuation-in-part of application No. 13/455,113, filed on Apr. 24, 2012, now Pat. No. 8,778,604.

(51) Int. Cl.
*G03F 1/00* (2012.01)
*G06F 17/50* (2006.01)
*G03F 7/20* (2006.01)

(52) U.S. Cl.
CPC .............. *G06F 17/5081* (2013.01); *G03F 1/00* (2013.01); *G03F 7/20* (2013.01); *G03F 7/70466* (2013.01)

(58) Field of Classification Search
CPC .... G03F 1/00; G03F 7/70466; G06F 17/5081

USPC ....................................................... 430/5, 394
See application file for complete search history.

(56) References Cited

U.S. PATENT DOCUMENTS

| | | | |
|---|---|---|---|
| 6,194,105 B1 | 2/2001 | Shacham | |
| 6,541,166 B2 | 4/2003 | Mansfield et al. | |
| 7,247,887 B2 | 7/2007 | King et al. | |
| 7,604,907 B2 | 10/2009 | Lee | |
| 7,913,197 B1 | 3/2011 | Kruger | |
| 7,945,869 B2 | 5/2011 | Haffner | |
| 8,778,604 B2 * | 7/2014 | Kuo et al. | 430/394 |
| 2003/0095267 A1 | 5/2003 | Mieher | |
| 2006/0073396 A1 * | 4/2006 | Lee et al. | 430/5 |
| 2007/0015088 A1 | 1/2007 | Lin | |
| 2007/0020565 A1 | 1/2007 | Koh et al. | |
| 2007/0158756 A1 | 7/2007 | Dreeskornfeld et al. | |
| 2008/0248429 A1 | 10/2008 | Chou et al. | |
| 2009/0233238 A1 | 9/2009 | Hsu et al. | |
| 2009/0258500 A1 | 10/2009 | Yang et al. | |
| 2009/0319978 A1 | 12/2009 | Gleason | |
| 2010/0167537 A1 * | 7/2010 | Aton | 438/674 |
| 2012/0319287 A1 | 12/2012 | Huang | |
| 2013/0007674 A1 | 1/2013 | Abou Ghaida | |
| 2013/0280645 A1 * | 10/2013 | Kuo et al. | 430/5 |

* cited by examiner

*Primary Examiner* — Stewart Fraser
(74) *Attorney, Agent, or Firm* — Winston Hsu; Scott Margo

(57) ABSTRACT

A mask set for double exposure process and method of using said mask set. The mask set is provided with a first mask pattern having a first base and a plurality of first teeth and protruding portions, and a second mask pattern having a second base and a plurality of second teeth, wherein the second base may at least partially overlap the first base such that each of the protruding portions at least partially overlaps one of the second teeth.

18 Claims, 7 Drawing Sheets

MASK SET FOR DOUBLE EXPOSURE PROCESS AND METHOD OF USING THE MASK SET

CROSS REFERENCE TO RELATED APPLICATIONS

This Continuation-in-Part application claims the benefit of U.S. application Ser. No. 13/455,113, which was filed on Apr. 24, 2012 and entitled "MASK SET FOR DOUBLE EXPOSURE PROCESS AND METHOD OF USING THE MASK SET".

BACKGROUND OF THE INVENTION

1. Field of the Invention

The invention relates generally to a multiple exposure technology, and more specifically, to a mask set for double exposure process and the method of decomposing the mask pattern.

2. Description of the Prior Art

Optical lithography is a crucial step in semiconductor manufacturing. The basic principle of optical lithography is quite similar to that of chemistry-based photography. The images of the patterned photo-mask are projected through the high-precision optical system onto the wafer surface, which is coated with a layer of light-sensitive chemical compound, e.g. photo-resist. The patterns are then formed on the wafer surface after complex chemical reactions and follow-on manufacturing steps, such as development, post-exposure bake, and wet or dry etching.

The resolution of the photo-lithography system (R) can be described by the well-known Rayleigh's equation:

$$R = \frac{k_1 \lambda}{NA}$$

in which $\lambda$ is the wavelength of the light source, NA is the numerical aperture, and $k_1$ is the factor describing the complexity of resolution enhancement techniques (RETs). As the very-large-scale integration (VLSI) technology pushes further into nanometer region, the feasible wavelength of the photo-lithographic system remains unchanged at 193 nm. Although there is anticipation that extreme ultraviolet lithography (EUVL) with the wavelength of 13 nm will replace traditional optical lithography, the availability of EUVL remains uncertain due to technical challenges and cost issues. On the other hand, the physical limit of dry lithography of NA is 1.0. The recently introduced immersion lithography has bigger NA (1.2), but it is harder to further increase NA to even higher values. Thus it is commonly recognized that resolution enhancement techniques ($k_1$) remains a cost effective knob to achieve finer resolution.

As the gap between the required feature size and lithography wavelength gets bigger, the final wafer images are quite different from the patterns on the mask. In the past few years, resolution enhancement techniques (RETs) have become necessary in order to achieve the required pattern density. One well-known RET is the optical proximity correction (OPC), in which the mask patterns are intentionally "distorted" so that the desired image can be formed on the wafer. Nowadays, considerable amount of computing power has to be dedicated to these kinds of post-layout processes.

In addition to the above-mentioned OPC technology, a process of double patterning has been developed as a cost-effective way to further scale into the deep submicron domain, using the same lithographic technology. One popular form of double patterning is the double exposure lithography, wherein a given layout is split or decomposed into two sets of patterns, each of which is printed using a separate mask in a separate exposure step. The desired layout may be constructed by these two separate patterns.

The greatest advantage of double exposure lithography is that we can use available photo-lithography technology and tools to manufacture finer patterns with even higher density. However, there are still many process issues to overcome in practice. For example, the large overlay region of two decomposed patterns is prone to suffer film punching problems after the etching process. Furthermore, in the application of splitting one single comb pattern into two comb patterns, the tooth portion of comb patterns may have inconsistent or asymmetric corner rounding profile due to the different pitches between the teeth. Besides, for some conventional double exposure method, the resulting target photoresist pattern formed from the two decomposed patterns may lack necessary corner rounding features in connection positions of teeth and base portions due to the perpendicular intersection thereof, thereby introducing potential leakage issue.

Therefore, it is still necessary to improve the conventional pattern split method for double exposure process in order to overcome the above-mentioned problems.

SUMMARY OF THE INVENTION

To resolve the above-mentioned issues of the prior art, a novel mask set (or mask pattern set) for double exposure process and method of using said mask set are provided in present invention. In the method of present invention, one single target comb mask pattern is split into two comb sub-mask patterns having particular features. The two comb sub-mask patterns may be overlapped in a specific way to constitute the original target comb mask pattern.

One objective of the present invention is to provide a mask set for double exposure process comprising a first mask pattern and a second mask pattern. The first mask pattern is provided with a first base and a plurality of first teeth and protruding portions extending from said first base and alternately aligning in a first direction. The second mask pattern is provided with a second base and a plurality of second teeth extending from said second base, wherein said second base may at least partially overlap said first base so that each of said protruding portions at least partially overlap one of said second teeth.

Another object of the present invention is to provide a method of forming a mask pattern on a substrate. The method comprises the steps of providing a mask pattern having a base and a plurality of spaced-apart teeth, splitting said mask pattern into a first sub-mask pattern and a second sub-mask pattern, wherein said first sub-mask pattern is provided with a first base and a plurality of first teeth and protruding portions extending from said first base and alternately aligning along a first direction, said second sub-mask pattern is provided with a second base and a plurality of second teeth extending from said second base, said second base may at least partially overlap said first base so that each of said protruding portions at least partially overlap one of said second teeth; and forming a first mask and a second mask respectively having said first sub-mask pattern and said second sub-mask pattern.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
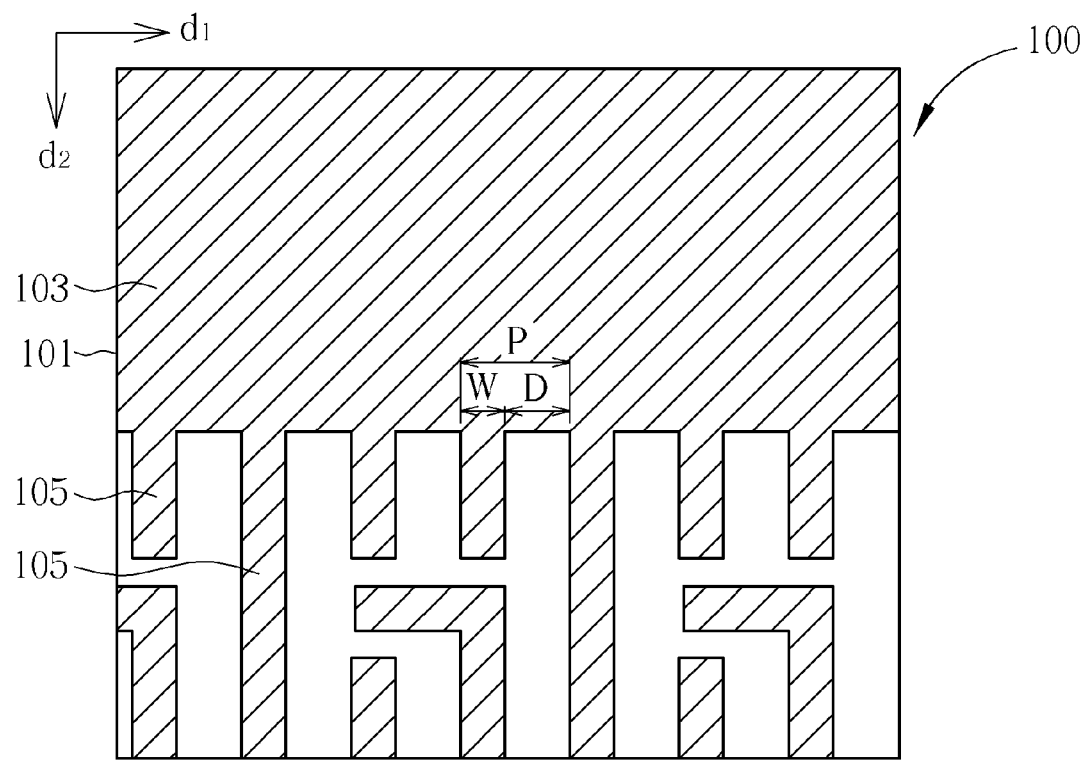
FIG. 1 is a top view illustrating a part of the first sub-mask pattern in accordance with the first preferred embodiment of present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the invention, reference is made to the accompanying drawings which form a part hereof, and in which is shown, by way of illustration, specific embodiments in which the invention may be practiced. These embodiments are described in sufficient details to enable those skilled in the art to practice the invention. Other embodiments may be utilized and structural, logical, and electrical changes may be made without departing from the scope of the present invention.

Figure 2:
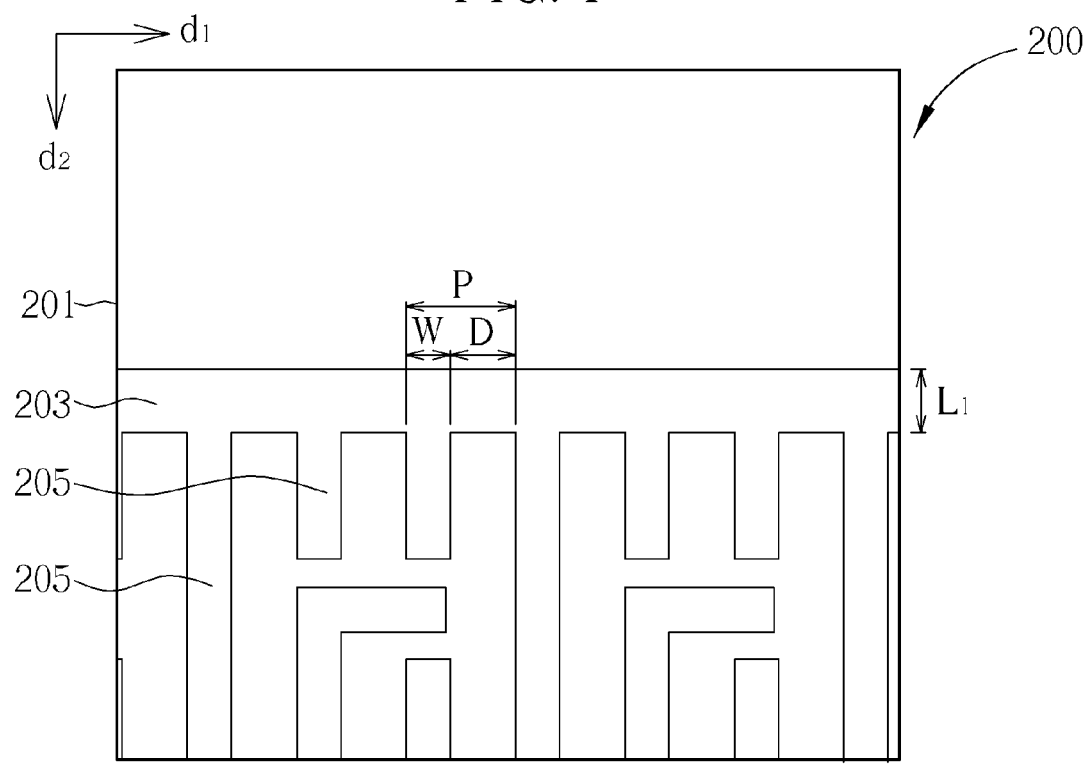
FIG. 2 is a top view illustrating a part of the second sub-mask pattern in accordance with the first preferred embodiment of present invention.
Figure 3:
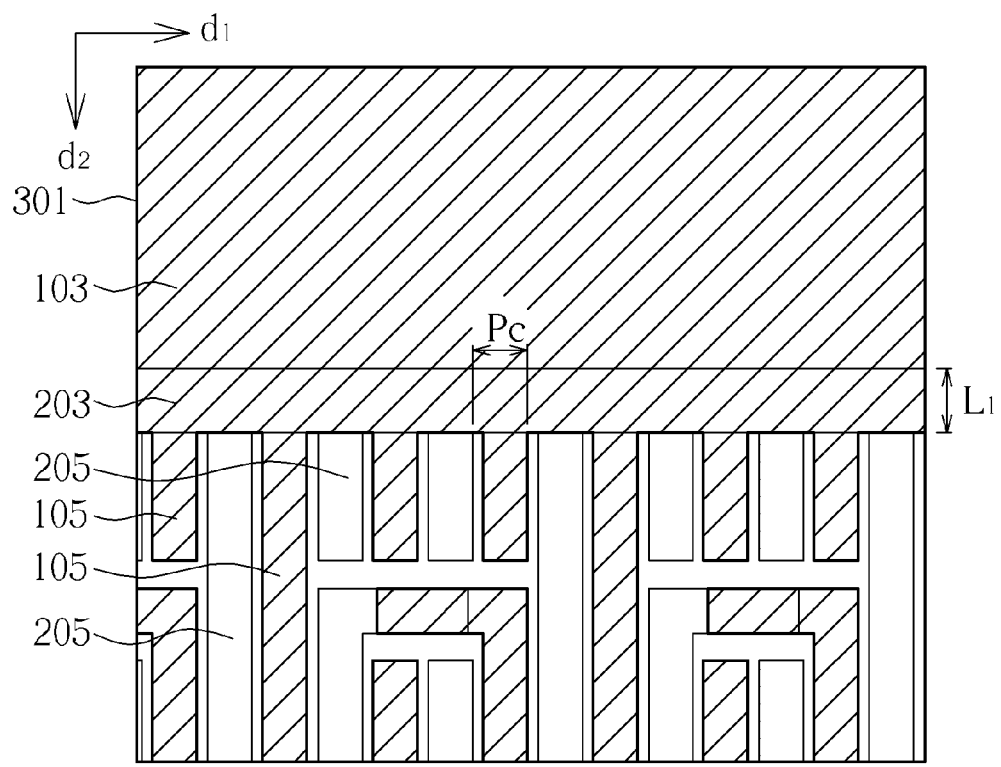
FIG. 3 is a top view illustrating a part of the target mask pattern made by simulating the overlapping of the first sub-mask pattern and the second sub-mask pattern in accordance with the first preferred embodiment of present invention.
Figure 5:
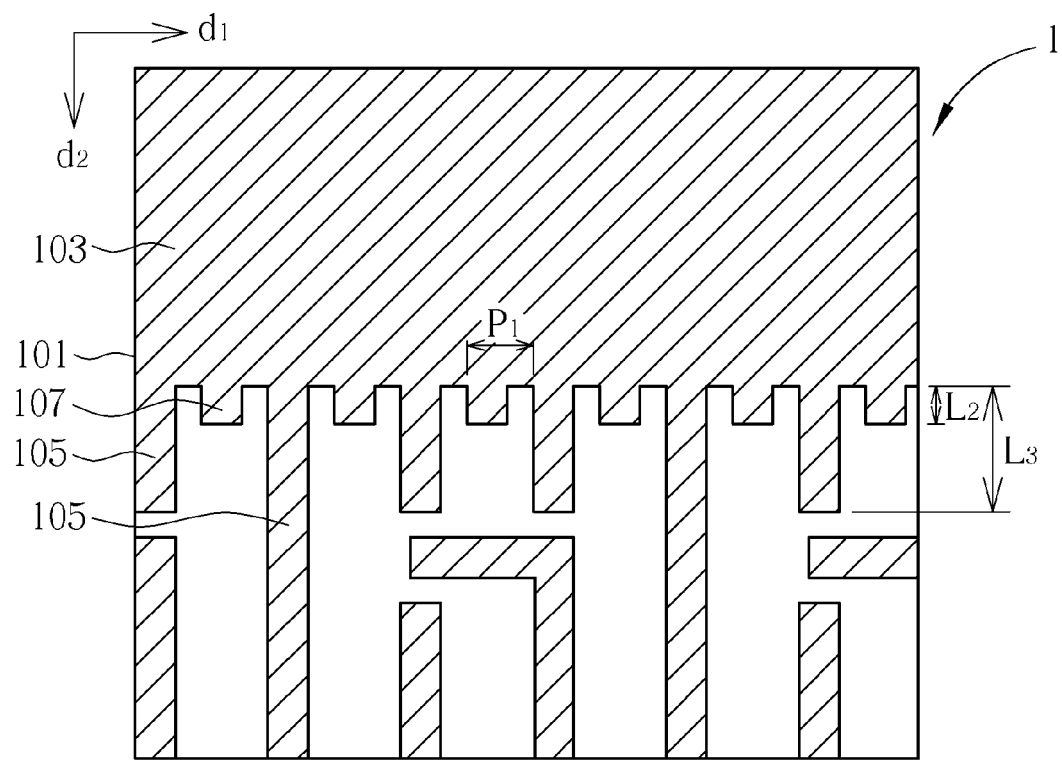
FIG. 5 is a top view illustrating a part of the first sub-mask pattern in accordance with the second preferred embodiment of present invention.
Figure 6:
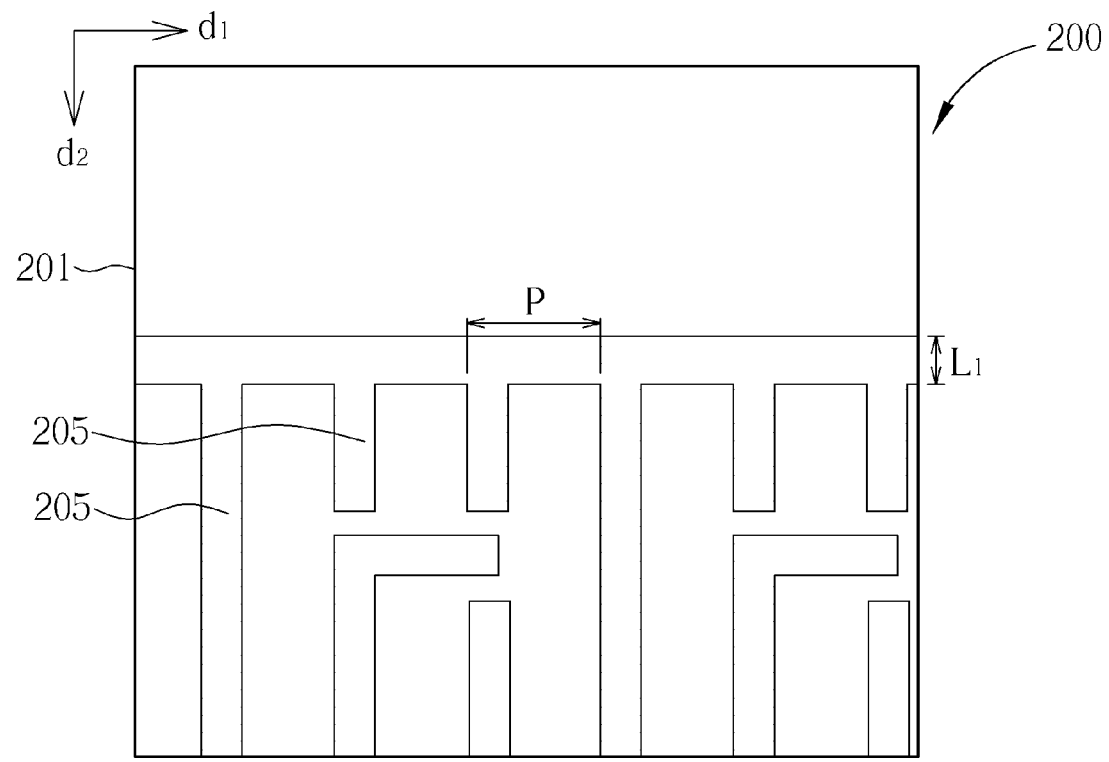
FIG. 6 is a top view illustrating a part of the second sub-mask pattern in accordance with the second preferred embodiment of present invention.
Figure 7:
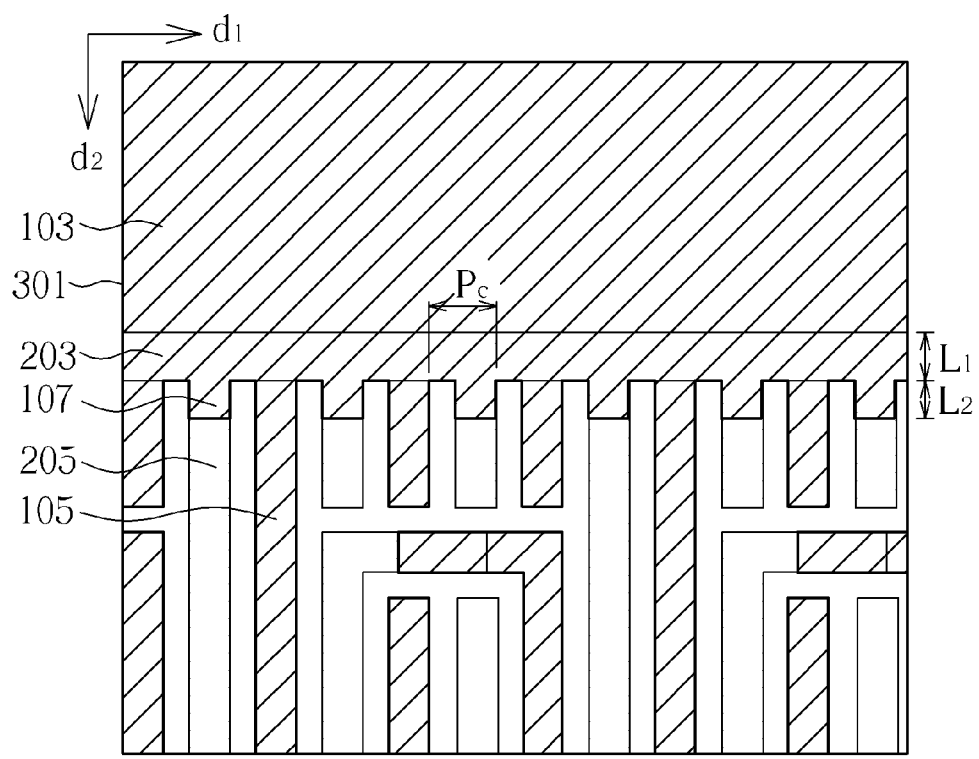
FIG. 7 is a top view illustrating a part of the target mask pattern made by simulating the overlapping of the first sub-mask pattern and the second sub-mask pattern in accordance with the first preferred embodiment of present invention.

The embodiments will now be explained with reference to the accompanying drawings to provide a better understanding of the process of the present invention, wherein FIGS. 1-3 are top views illustrating the mask patterns in accordance with the first preferred embodiment of the present invention; FIGS. 5-7 are top views illustrating the mask patterns in accordance with the second preferred embodiment of the present invention.

The method of present invention relates to a double exposure technology, in which the basic principle is to split one single mask pattern into two sub-mask patterns. The two sub-mask patterns are then used in the photolithography process to form overlapped target patterns. In the method of the present invention, the adjacent circuit features (ex. the teeth of a comb circuit pattern) in said single mask pattern will be decomposed into two corresponding circuit features formed respectively in two sub-mask patterns. The overlapped target mask pattern is then defined by using said two sub-mask patterns in two individual exposure processes. In this way, the problem of insufficient exposure resolution for the photolithography process in deep submicron domain may be effectively resolved.

In the method of present invention, the decomposed sub-mask patterns may be slightly different depending on their circuit pitches. For example, the first preferred embodiment of present invention provides the sub-mask patterns and the overlapping manner thereof feasible at the condition that the circuit pitch of the target pattern is smaller than a predetermined value (ex. 90 nm), while the second preferred embodiment of the present invention provides the sub-mask patterns and overlapping manner thereof feasible at the condition that the circuit pitch of the target pattern is larger than or equal to a predetermined value (ex. 90 nm).

First, please refer to FIG. 1 and FIG. 2, in which the top views of a first sub-mask pattern 101 on a first mask 100 and a second sub-mask pattern 201 on a second mask 200 are respectively illustrated, in accordance with the first preferred embodiment of the present invention. The first sub-mask pattern 101 and the second sub-mask pattern 201 are corresponding sub-mask patterns decomposed from one single target mask pattern by utilizing a computer system. The first sub-mask pattern 101 and the second sub-mask pattern 201 are then outputted respectively to a first mask and a second mask to perform a double exposure process. By using a specific overlapping manner, the two sub-mask patterns may constitute the original target mask pattern (as shown in FIG. 3) on a photo-sensitive layer (ex. photoresist). The first mask 100 and the second mask 200 may serve collectively as a mask set for double exposure process.

For present preferred embodiment, the first sub-mask pattern 101 is generally composed of a first base 103 and a plurality of first teeth 105. The first teeth 105 are spaced along a first direction d1 and extend along a second direction $d_2$ from one side of the first base 103. The second sub-mask pattern 201 is generally composed of a second base 203 and a plurality of second teeth 205. The second teeth 205 are spaced along the first direction d1 and extend along the second direction $d_2$ from one side of the second base 203. Please note that although the teeth features of the two mask pattern in the present embodiment are illustrated as being perpendicularly extending from the base portion, the teeth features may extend along a different direction from the base portion in other embodiment of present invention.

Preferably, the first teeth 105 and the second teeth 205 may have the same width W and pitch P, and the spacing D (i.e. pitch P-width W) between the first teeth 105 or between the second teeth 205 should be larger than the width W in order to overlap the two sub-mask patterns 101 and 201 and obtain the teeth features with regular arrangement after the overlapping.

Subsequently, please refer to FIG. 3, in which the top view of the target layout made by simulating the overlapping of the first sub-mask pattern 101 in FIG. 1 and the second sub-mask pattern 201 in FIG. 2 is illustrated. For the mask overlapping of present invention, the entire second base 203 of the second mask pattern is overlapping at least part of the first base of the first mask pattern, and the first teeth 105 of the first sub-mask pattern 101 is alternately aligning with the second teeth 205 of the second sub-mask pattern 201. One technical feature of present invention is that the teeth of both sub-mask patterns 101, 201 extend from a base portion, and the base of one sub-mask pattern is far smaller than the base of the other one. With respect to the photolithography process, using the base portions of two sub-mask patent as the overlapping anchor may induce corner rounding effect at the teeth portions of resulting target photoresist patterns, like the corner portions 402 shown in FIG. 4. That is, the profile in the connection positions of the base portion and the teeth portion are not perpendicular. In this manner, the leakage issue resulted from sharp corner profile of the teeth portion of overlapped target mask pattern in prior may be avoided.

On the other hand, as shown in FIG. 3, the length $L_1$ of second base 203 of second sub-mask pattern in second direction $d_2$ is far smaller than the one of first base 103 in first sub-mask pattern. By using this kind of overlapping manner, the overlapped region (i.e. the second base 203 of second sub-mask pattern) of first sub-mask pattern and second sub-mask pattern will be smaller, thereby preventing the film punching of the etch target layer after the following etching process due to oversized overlapped region of the two sub-mask patterns.

In the present preferred embodiment, the length $L_1$ of the overlapped region of the two sub-mask patterns may have some correlations with the teeth pitch $P_c$ of the target mask pattern 301. The length $L_1$ may be a function of the teeth pitch $P_c$. For example, the length $L_1$ may range from half of the teeth pitch $P_c$ to one teeth pitch $P_c$. Preferably, the pitch $P_c$ of target mask pattern is smaller than 90 nm and the length $L_1$ of the overlapped region is 60 nm. The optimized target mask pattern may be obtained by using the above-exemplified parameters.

Figure 4:
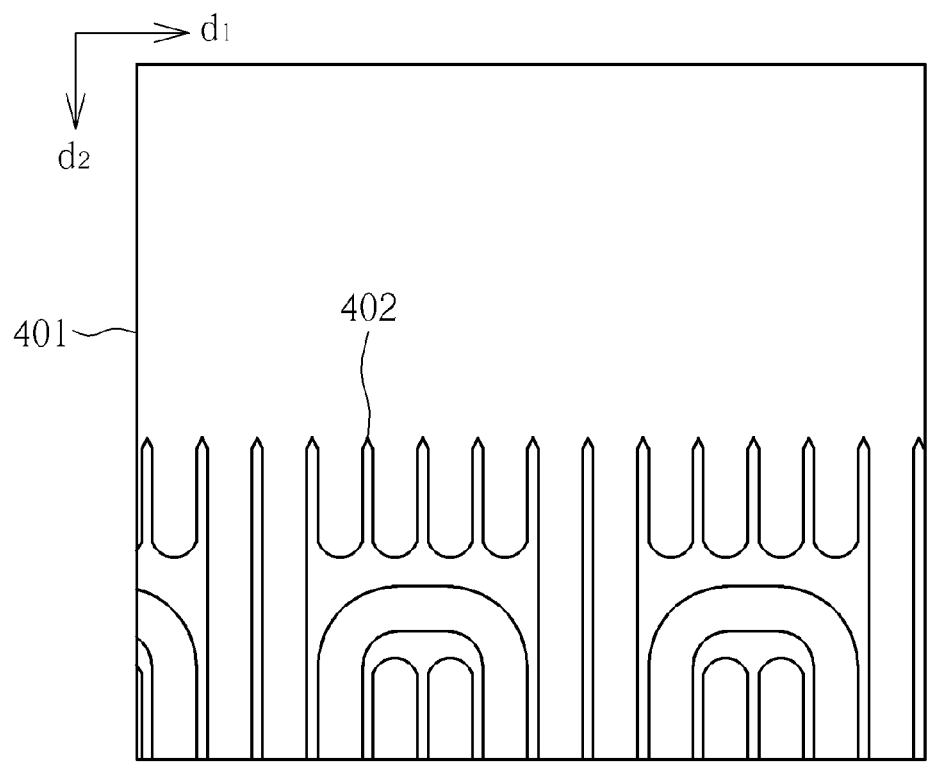
FIG. 4 is a top view illustrating a photoresist pattern formed by using the first sub-mask pattern in FIG. 1 and the second sub-mask pattern in FIG. 2 to perform a double exposure process on a photoresist layer.

Subsequently, please refer to FIG. 4, in which the top view of a photoresist contour 401 is illustrated. The photoresist contour 401 is formed by using the first sub-mask pattern 101 in FIG. 1 and the second sub-mask pattern 201 in FIG. 2 to perform a double exposure process on a photoresist layer of a substrate. In the implementation of a photolithography process, the real pattern printed on the photoresist may be slightly different from the original mask pattern, wherein the most significant difference is that the corner features of the photoresist pattern may be rounded. Thus, as it is clearly shown in FIG. 4, all corner portions of the target mask pattern in FIG. 3 are rounded into a smoother profile. In the present invention, the teeth of the target mask patterns are equally spaced so that the corner portion 402 of the resulting photoresist pattern 401 may have symmetry and a consistent rounding profile.

Please refer to FIG. 5 and FIG. 6, in which the top views of a first sub-mask pattern 101 on a first mask 100 and a second sub-mask pattern 201 on a second mask 200 are respectively illustrated in accordance with the second preferred embodiment of the present invention. The first sub-mask pattern 101 and the second sub-mask pattern 201 are corresponding sub-mask patterns decomposed from one single target mask pattern by utilizing a computer system. The two sub-mask patterns may constitute the original target mask pattern (as shown in FIG. 7) by specific overlapping manner.

The difference between the present preferred embodiment and previous preferred embodiment is that the first sub-mask pattern 101 in the present preferred embodiment is provided with protruding features. As shown in FIG. 5, the first sub-mask pattern 101 is generally composed of a first base 103 and a plurality of first teeth 105 and protruding portions 107. The first teeth 105 and the protruding portions 107 are alternately aligned along a first direction $d_1$ and extend along a second direction $d_2$ from one side of the first base 103, and the position of each protruding portion 107 is corresponding to one second tooth 205 of the second sub-mask pattern 201. Also, the length $L_2$ of the protruding portions 107 is smaller than the length $L_3$ of the first tooth 105.

By forming the protruding portions on the first sub-mask pattern 101, the teeth portion of decomposed first sub-mask pattern 101 and decomposed second sub-mask pattern 201 may be arranged more regularly. Especially at the condition that the teeth pitch (as the pitch $P_c$ shown in FIG. 7) of the overlapped target mask pattern is sufficient, the sub-mask pattern may be provided with protruding portions to improve the decomposition of the mask pattern. Thus, it is preferable to determine if the teeth pitch of target mask pattern is larger than or equal to a predetermined value (ex. 90 nm) by utilizing a computerized system before the decomposition of the target mask pattern. This determination may help us to decide whether the protruding portion should be formed between the teeth of one of the decomposed sub-mask patterns, as the example shown in the present second preferred embodiment. On the contrary, if the teeth pitch of the target mask pattern is smaller than the predetermined value (ex. 90 nm), the manner of the first preferred embodiment which provides no protruding portion will be adopted.

The second sub-mask pattern 201 illustrated in FIG. 6 is similar to the one illustrated in FIG. 2 except for their different teeth pitches P. Thus, the description of relevant components will be omitted herein for the sake of simplicity. Please refer to FIG. 2 for more details if necessary.

Subsequently, please refer to FIG. 7, in which the top view of the target layout 301 made by simulating the overlapping of the first sub-mask pattern 101 in FIG. 5 and the second sub-mask pattern 201 in FIG. 6 is illustrated. For the overlapping of mask patterns in present invention, the entire second base 203 of the second mask pattern is overlapping at least a part of the first base of the first mask pattern, and each protruding portion 107 of the first sub-mask pattern 101 overlaps at least part of one second tooth 205 of the second sub-mask pattern 201. Similarly to the previous embodiment shown in FIG. 3, the teeth of both sub-mask patterns 101, 201 extend from a base portion. Furthermore, the length $L_1$ of second base 203 of the second sub-mask pattern in the second direction $d_2$ is far smaller than the one of the first base 103 in the first sub-mask pattern.

In the present preferred embodiment, the length $L_1$ of the overlapped region of the two sub-mask patterns may have some correlations with the teeth pitch $P_c$ of the target mask pattern 301 or the pitch $P_1$ of the first teeth 105 and the protruding portion 107 of the first sub-mask pattern 101. The length $L_1$ may be a function of the pitch $P_c$ or the pitch $P_1$. For example, the length $L_1$ may range from half of the teeth pitch $P_c$ to one teeth pitch $P_c$. Preferably, the pitch $P_c$ of the target mask pattern 301 is larger than or equal to 90 nm and the length $L_1$ of the overlapped region is 60 nm. The optimized target mask pattern may be obtained by using the above-exemplified parameters.

On the other hand, the length $L_2$ of the protruding portion 107 of the first sub-mask pattern 101 may have some correlations with the teeth pitch $P_c$ of the target mask pattern 301 or the pitch $P_1$ of the first teeth 105 and the protruding portion 107 of the first sub-mask pattern 101. The length $L_2$ may be a function of the pitch $P_c$ or the pitch $P_1$. For example, the length $L_2$ may range from half of the teeth pitch $P_c$ to one teeth pitch $P_c$. Preferably, the pitch $P_c$ of the target mask pattern 301 is larger than or equal to 90 nm and the length $L_2$ of the protruding portion 107 is 60 nm. The optimized target mask pattern may be obtained by using the above-exemplified parameters.

Subsequently, please refer to FIG. 8, in which the top view of a photoresist contour 401 is illustrated. The photoresist contour 401 is formed by using the first sub-mask pattern 101 in FIG. 5 and the second sub-mask pattern 201 in FIG. 6 to perform a double exposure process on a photoresist layer of a substrate. Similar to the embodiment shown in FIG. 4, in the implementation of the photo-lithography process, the corner features of the photoresist pattern 401, including the corner portion 402 and the corner portion 404, may be rounded. Especially, the profile in the connection position (i.e. corner portion 402) of the teeth portion and the base portion is not perpendicular, thereby overcoming the leakage problem.

Figure 8:
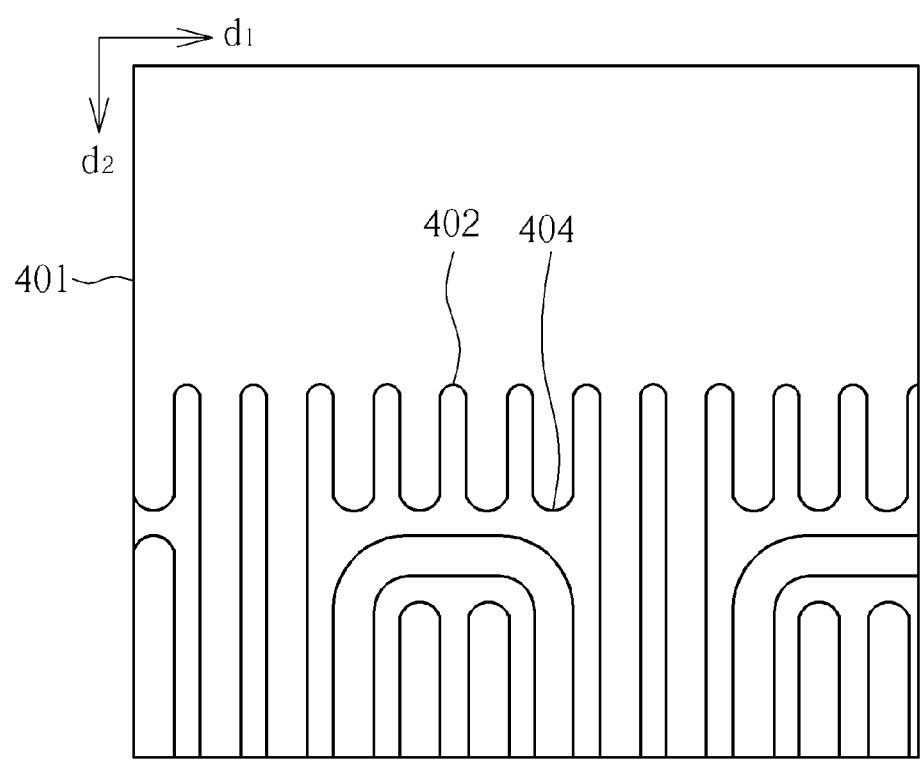
FIG. 8 is a top view illustrating a photoresist pattern formed by using the first sub-mask pattern in FIG. 5 and the second sub-mask pattern in FIG. 6 to perform a double exposure process on a photoresist layer.

In summary, the advantage of the present invention is that, with respect to the photolithography process, by using the base portions of two sub-mask patents as the overlapping anchor, the resulting target photoresist patterns may have rounded corner at the teeth portions, like the corner portions 402 shown in FIG. 8. This way, the leakage issue resulted from the sharp corner profile of the teeth portions of the overlapped target mask pattern in prior art may be avoided. Also, the design of smaller overlapped regions (i.e. the second base 203 of second sub-mask pattern) of the first sub-mask pattern and the second one may prevent the film punching issue of the etch target layer after the following etching process due to the oversized overlapped region of the two sub-mask patterns. Furthermore, the design of forming protruding features at corresponding teeth positions may lead to better, more symmetric corner rounding profiles at the corner portions of the teeth in the target photoresist pattern, thereby overcoming the leakage problem.

Figure 9:
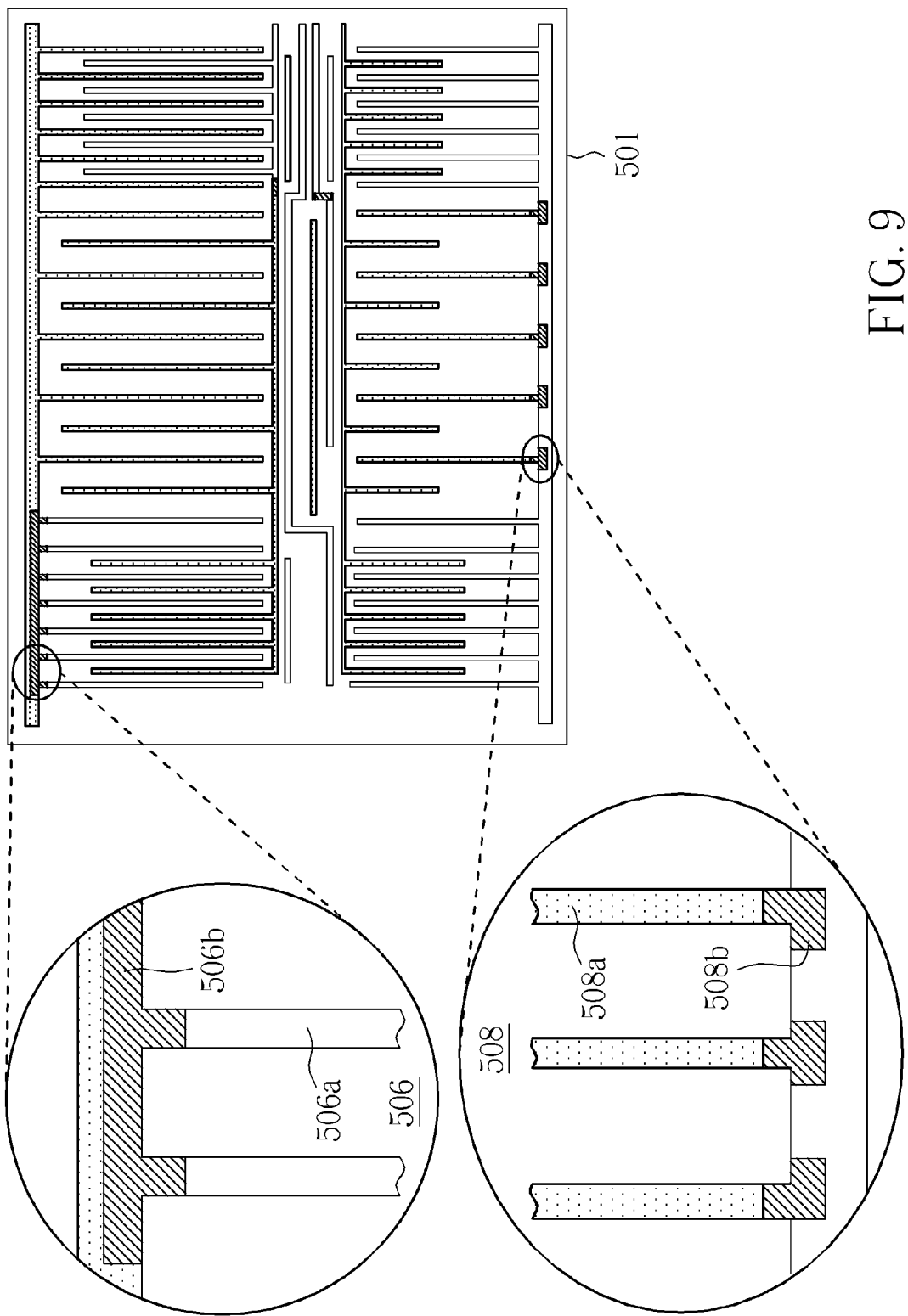
FIG. 9 is a target mask pattern in a circuit layout formed by the overlapping of two sub-mask patterns.

Please refer now to FIG. 9, in which a part of the target mask pattern 501 formed by overlapping the two sub-mask patterns in a circuit layout is illustrated. The dark region in FIG. 9 represents the overlapped region of the two sub-mask patterns. In the present invention, the base of the overlapped region may be different depending on the pitch or the density of the teeth region. The detailed profiles of the two different overlapped regions 506 and 508 are illustrated respectively in two enlarge views of FIG. 9, For the overlapped region 506 with a relative small teeth pitch, the teeth 506a have a common base 506b, while for the overlapped region 508 with a relative large teeth pitch, the teeth 508a have a respective base 508b. Furthermore, the base 508b may have different design variations, such as ⌊-shape, reversed ⊥-shape or ⌋-shape, depending on the position of teeth.

Figure 10:
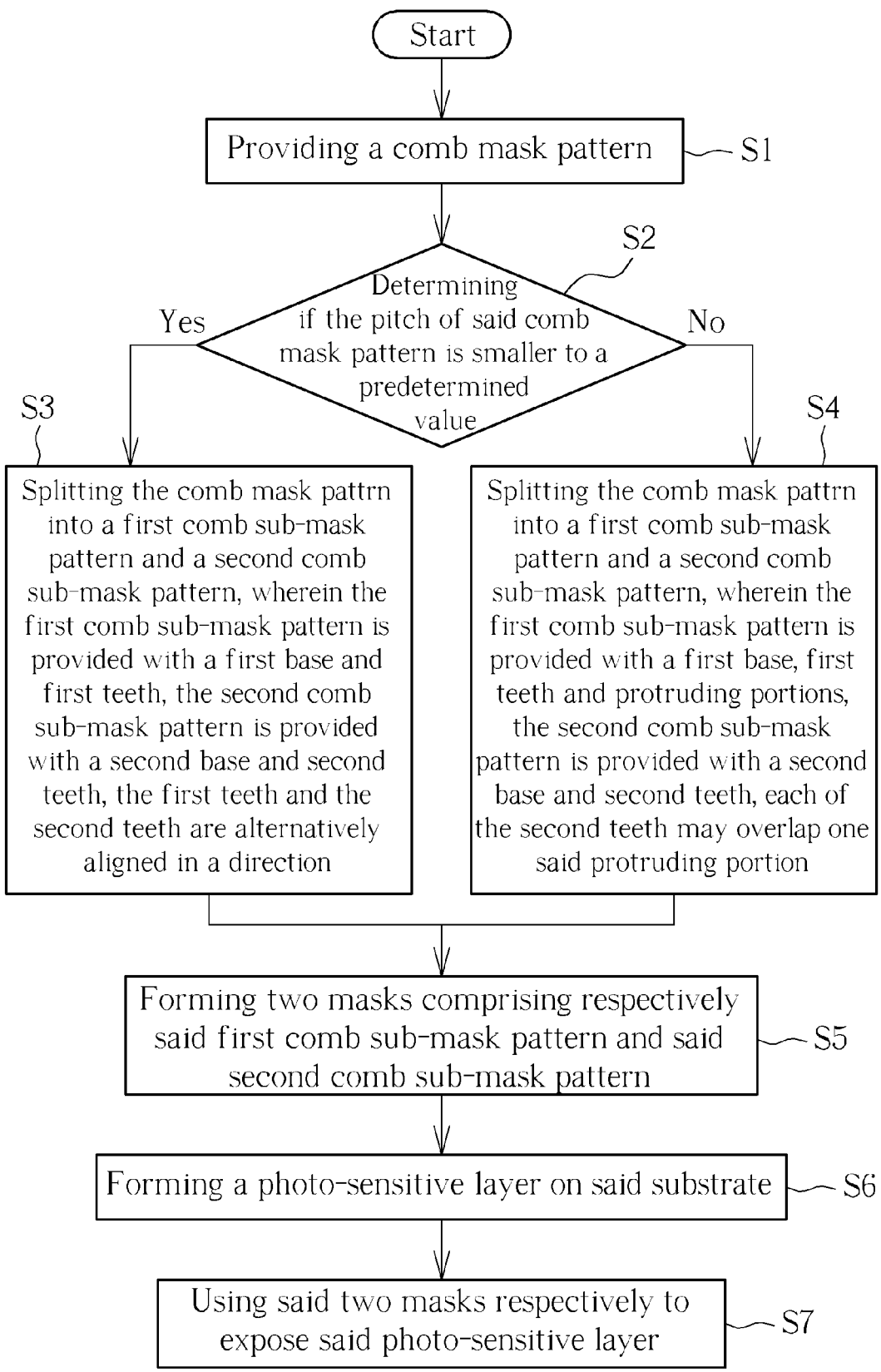
FIG. 10 is a flowchart of the method for forming a mask pattern in present invention.

Based on the foregoing first sub-mask pattern and second sub-mask pattern and the overlapping manner thereof, a method of forming a mask pattern on a substrate is also provided in the present invention. Please refer now to FIG. 10, in which the flowchart for forming a mask pattern (especially the comb mask pattern) is illustrated. The Flowchart includes: first, in step S1, providing a comb mask pattern like the target mask pattern to be printed on a photo-sensitive layer (ex. photoresist). Said comb mask pattern may have a base and a plurality of spaced teeth features. In the present invention, the comb mask pattern should be split into two individual comb sub-mask patterns. The step of pattern split may be executed by a software stored in a computer system based on specific rules. It could be, for example, in step S2, utilizing the software to determine in advance whether the teeth pitch of the desired target comb mask pattern is smaller than a predetermined value. According to the result of this determination, the comb mask pattern may be split into a first comb sub-mask pattern and a corresponding second comb sub-mask pattern by the software.

For example, as shown in step S3, at the condition that the determination shows that the teeth pitch of the comb mask pattern is smaller than a predetermined value (ex. 90 nm), the first comb sub-mask pattern decomposed by the software will be provided with a first base and a plurality of first teeth extending from said first base and alternately aligning along a first direction (as shown in FIG. 1), and the second comb sub-mask pattern will be provided with a second base and a plurality of second teeth extending from said second base and alternately aligning along a first direction (as shown in FIG. 2), wherein the second base of said second comb sub-mask pattern may at least partially overlap the first base of said first comb sub-mask pattern so that said plurality of first teeth and said plurality of second teeth are alternately aligned in said first direction (as shown in FIG. 3).

On the other hand, as shown in step S4, at the condition that the determination shows that the teeth pitch of the comb mask pattern is larger than or equal to a predetermined value (ex. 90 nm), the first comb sub-mask pattern decomposed by the software will be provided with a first base and a plurality of first teeth and protruding portions extending from said first base and alternately aligning along a first direction (as shown in FIG. 5), and the second comb sub-mask pattern will be provided with a second base and a plurality of second teeth extending from said second base and alternatively aligning along a first direction (as shown in FIG. 6), wherein the second base of said second comb sub-mask pattern may at least partially overlap the first base of said first comb sub-mask pattern so that each protruding portions of said first comb sub-mask pattern is at least overlapping one second tooth of said second comb sub-mask pattern (as shown in FIG. 7).

After the decomposition of the target mask pattern, step S5 includes manufacturing two masks on the basis of said first comb sub-mask pattern and said second comb sub-mask pattern. The mask patterns on said two masks may comprise respectively said first comb sub-mask pattern and said second comb sub-mask pattern.

In step S6, forming a photo-sensitive layer (ex. a positive photoresist or negative photoresist) on a substrate. The following step S7 includes using said two masks formed in the previous steps respectively to perform a double exposure process on said photo-sensitive layer. For example, using the first mask having the first comb sub-mask pattern to expose said photo-sensitive layer. After the first exposure, the second mask having the second comb sub-mask pattern is then aligned with the substrate so that the second comb sub-mask pattern will overlap the first comb sub-mask pattern formed on the photo-sensitive layer in specific overlapped manner. The second exposure is then performed to complete the double exposure process. The two exposure steps may form an overlapped target photoresist pattern on the photo-sensitive layer.

Figure 11:
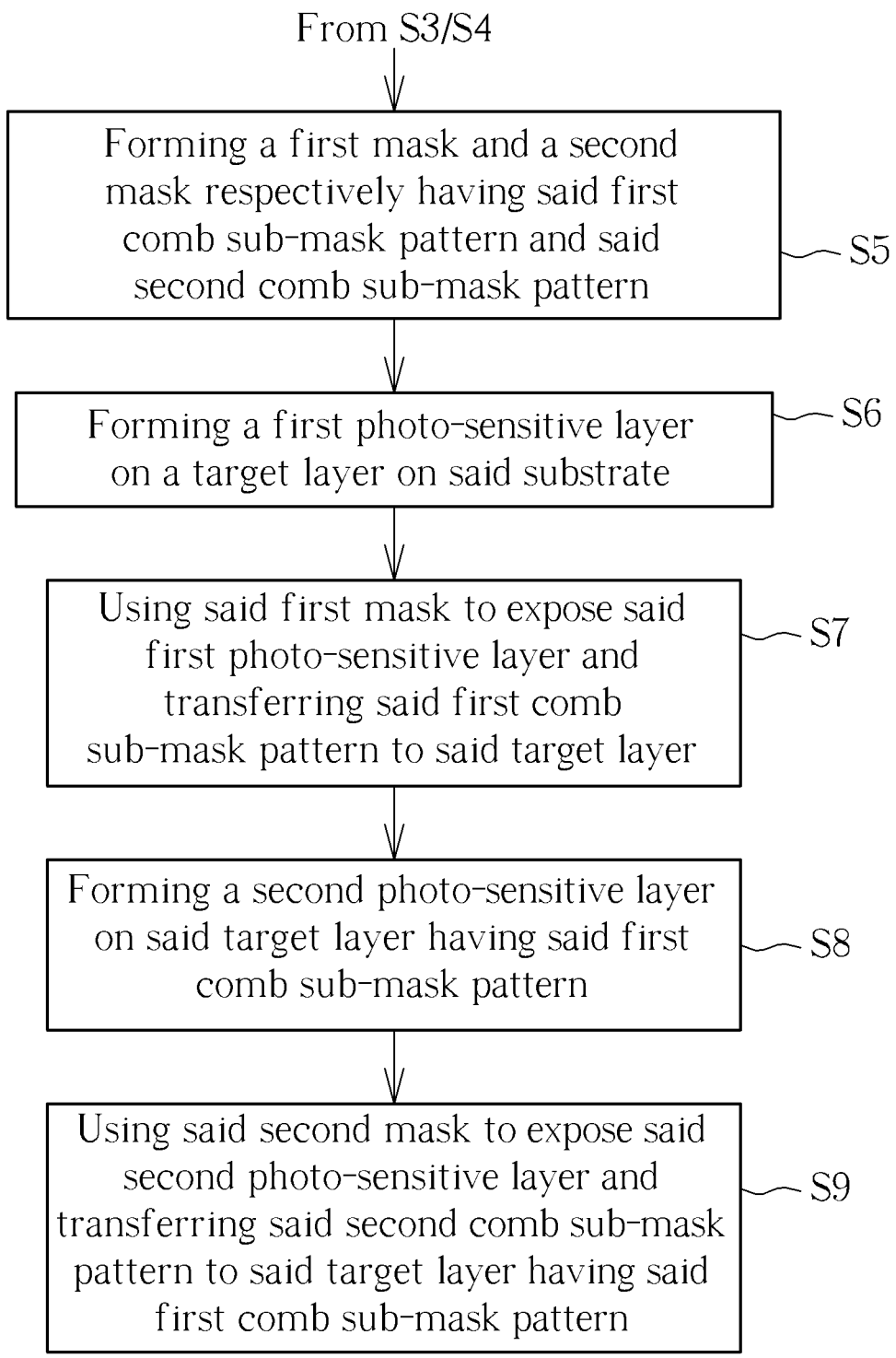
FIG. 11 is another flowchart of the method for forming a mask pattern using double patterning scheme in present invention.

The above embodiment shows the method of forming a mask pattern by using double exposure steps of two masks to one single photo-sensitive layer. In another embodiment, the pattern splitting method of the present invention may also be applied in double patterning scheme to pattern a target layer. Please refer now to FIG. 11, which is another flowchart for forming a mask pattern using double patterning scheme. The pattern splitting steps S1~S3 (or S4) in this flowchart are the same as the flowchart shown in FIG. 10. However, the two masks in this embodiment are used to define two photo-sensitive layers respectively rather than one photo-sensitive layer.

In step 5, after splitting the comb mask pattern into a first comb sub-mask patterns and a second comb sub-mask patterns, manufacturing a first mask and a second mask on the basis of said first comb sub-mask pattern and said second comb sub-mask pattern is performed. The mask patterns of said first mask and said second mask may comprise respectively said first comb sub-mask pattern and said second comb sub-mask pattern.

In step S6, forming a first photo-sensitive layer on a target layer on a substrate is performed. The following step S7 includes using said first mask formed in the previous steps to perform an exposure process on said first photo-sensitive layer. For example, using the first mask having the first comb sub-mask pattern to expose said first photo-sensitive layer, so that the first comb sub-mask pattern would be transferred to the first photo-sensitive layer.

Please note that in this embodiment, the first comb sub-mask pattern would be transferred to the target layer in advance without combining the second comb sub-mask pattern. The pattern may be transferred to the target layer by the method of etch process using the first photo-sensitive layer with the first comb sub-mask pattern to pattern the target layer. The first photo-sensitive layer may be removed after the target layer is patterned.

After the first exposure and pattern transfer, similar to step S6 and S7, forming a second photo-sensitive layer on patterned target layer having the first comb sub-mask pattern is performed (step S8). The following step S9 includes using the second mask formed in the previous steps to perform a second exposure process on the second photo-sensitive layer. For example, the second mask having the second comb sub-mask pattern is first aligned with the substrate so that the second comb sub-mask pattern will overlap the first comb sub-mask pattern formed on the patterned target layer in specific overlapped manner. The second exposure is then performed to transfer the second comb sub-mask pattern to the second photo-sensitive layer on the patterned target layer having the first comb sub-mask pattern. A second etch process may then be performed using the second photo-sensitive layer with the second comb sub-mask pattern to pattern again the patterned target layer having the first comb sub-mask pattern (i.e. double patterning), so that the two respective pattern steps form a complete mask pattern on the target layer. The second photo-sensitive layer may be removed after the patterning of the target layer is completed.

Software stored in a computer system, in accordance with the present disclosure, such as program code and/or data, may be stored on one or more machine-readable mediums, including non-transitory machine-readable medium. Some common forms of computer readable media include, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer is adapted to read. It is also contemplated that software identified herein may be implemented using one or more general purpose or specific purpose computers and/or computer systems, networked and/or otherwise. Computing system may perform specific operations by processing component executing one or more sequences of instructions contained memory component. In other embodiments, hard-wired circuitry may be used in place of or in combination with software instructions to implement the present disclosure. Logic may be encoded in a computer readable medium, which may refer to any medium that participates in providing instructions to processing component for execution, including memory component. Where applicable, the ordering of various steps described herein may be changed, combined into composite steps, and/or separated into sub-steps to provide features described herein.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A mask set for double exposure process, comprising:
a first mask having a first mask pattern, said first mask pattern is provided with a first base, a plurality of first teeth, and a plurality of protruding portions, wherein said first teeth and said protruding portions extend from said first base and alternately align along a first direction; and
a second mask having a second mask pattern, said second mask pattern is provided with a second base and a plurality of second teeth extending from said second base, wherein said second base may at least partially overlap said first base so that each of said protruding portions at least partially overlaps one of said second teeth.

2. The mask set for double exposure process according to claim 1, wherein the length of the overlapped region of said first base and said second base in a second direction ranges from half of the pitch of one of said first teeth and one of said protruding portions to one said pitch.

3. The mask set for double exposure process according to claim 2, wherein said pitch is larger than or equal to 90 nm.

4. The mask set for double exposure process according to claim 2, wherein said length is 60 nm.

5. The mask set for double exposure process according to claim 1, wherein the length of each of said protruding portions ranges from half of the pitch of one of said first teeth and one of said protruding portions to one said pitch.

6. The mask set for double exposure process according to claim 5, wherein said pitch is larger or equal to 90 nm.

7. The mask set for double exposure process according to claim 5, wherein the length of said protruding portion is 60 nm.

8. The mask set for double exposure process according to claim 1, wherein the lengths of said first teeth and said protruding portions are different.

9. A method of forming a mask pattern on a substrate executed by a computer system, comprising the steps of:
providing a mask pattern having a base and a plurality of spaced-apart teeth;
splitting said mask pattern into a first sub-mask pattern and a second sub-mask pattern, wherein said first sub-mask pattern is provided with a first base and a plurality of first teeth and protruding portions extending from said first base and alternately aligning along a first direction, said second sub-mask pattern is provided with a second base and a plurality of second teeth extending from said second base, said second base may at least partially overlap said first base so that each of said protruding portions at least partially overlap one of said second teeth;
forming a first mask and a second mask respectively having said first sub-mask pattern and said second sub-mask pattern;

forming a first photo-sensitive layer on a target layer on said substrate;

using said first mask to expose said first photo-sensitive layer and transferring said first sub-mask pattern to said target layer;

forming a second photo-sensitive layer on said target layer having said first sub-mask pattern; and using said second mask to expose said second photo-sensitive layer and transferring said second sub-mask pattern to said target layer having said first sub-mask pattern.

10. The method of forming a mask pattern on a substrate executed by a computer system according to claim 9, further comprising the step of determining if the pitch of said first teeth and said second teeth of said mask pattern is larger than or equal to a predetermined value before splitting said mask pattern.

11. The method of forming a mask pattern on a substrate executed by a computer system according to claim 10, wherein said predetermined value is 90 nm.

12. The method of forming a mask pattern on a substrate executed by a computer system according to claim 10, wherein the length of the overlapped region of said first base and said second base in a second direction ranges from half of the pitch of said first teeth and said second teeth to one said pitch of said first teeth and said second teeth.

13. The method of forming a mask pattern on a substrate executed by a computer system according to claim 12, wherein said length is 60 nm.

14. The method of forming a mask pattern on a substrate executed by a computer system according to claim 10, wherein the length of said protruding portion ranges from half of the pitch of said first teeth and said second teeth to one said pitch of said first teeth and said second teeth.

15. The method of forming a mask pattern on a substrate executed by a computer system according to claim 14, wherein the length of said protruding portion is 60 nm.

16. The method of forming a mask pattern on a substrate executed by a computer system according to claim 9, wherein said a plurality of second teeth of said second sub-mask pattern align along said first direction.

17. The method of forming a mask pattern on a substrate executed by a computer system according to claim 9, wherein the step of transferring said first sub-mask pattern to said target layer is by performing an etch process on said target layer using said first photo-sensitive layer having said first sub-mask pattern as a mask.

18. The method of forming a mask pattern on a substrate executed by a computer system according to claim 9, wherein the step of transferring said second sub-mask pattern to said target layer having said first sub-mask pattern is by performing an etch process on said target layer said first sub-mask pattern using said second photo-sensitive layer having said second sub-mask pattern as a mask.

\* \* \* \* \*